US007081961B2

United States Patent
Hansen

(10) Patent No.: US 7,081,961 B2
(45) Date of Patent: *Jul. 25, 2006

(54) METHOD AND APPARATUS FOR CHARACTERIZATION OF OPTICAL SYSTEMS

(75) Inventor: Matthew E. Hansen, Milford, CT (US)

(73) Assignee: ASML Holding N.V., Veldhoven (NL)

( * ) Notice: Subject to any disclaimer, the term of this patent is extended or adjusted under 35 U.S.C. 154(b) by 3 days.

This patent is subject to a terminal disclaimer.

(21) Appl. No.: 10/786,361

(22) Filed: Feb. 26, 2004

(65) Prior Publication Data

US 2004/0165194 A1 Aug. 26, 2004

Related U.S. Application Data

(63) Continuation of application No. 09/339,506, filed on Jun. 24, 1999.

(51) Int. Cl.
*G01B 9/02* (2006.01)
*G01B 9/00* (2006.01)

(52) U.S. Cl. .................... 356/515; 356/124

(58) Field of Classification Search ............ 356/515
See application file for complete search history.

(56) References Cited

U.S. PATENT DOCUMENTS

| | | | |
|---|---|---|---|
| 3,829,219 A | 8/1974 | Wyant | |
| 4,289,959 A | 9/1981 | Takayama et al. | |
| 4,732,483 A * | 3/1988 | Biegen | 356/495 |
| 5,128,530 A | 7/1992 | Ellerbroek et al. | |
| 5,182,455 A | 1/1993 | Muraki | |
| 5,814,425 A | 9/1998 | Kataoka et al. | |
| 5,825,476 A | 10/1998 | Abitol et al. | |
| 5,898,479 A | 4/1999 | Hubbard et al. | |
| 5,923,423 A * | 7/1999 | Sawatari et al. | 356/484 |
| 6,257,763 B1 | 7/2001 | Stolmeier et al. | |
| 6,360,012 B1 | 3/2002 | Kreuzer | |

(Continued)

FOREIGN PATENT DOCUMENTS

EP 0 628 806 A2 4/1994

(Continued)

OTHER PUBLICATIONS

Ross, I.N. et al., "High-resolution holographic image projection at visible and ultraviolet wavelengths," *Applied Optics*, vol. 27, No. 5, Mar. 1, 1988, pp. 967-972.

(Continued)

*Primary Examiner*—Hwa (Andrew) Lee
(74) *Attorney, Agent, or Firm*—Sterne, Kessler, Goldstein & Fox P.L.L.C.

(57) ABSTRACT

Characterization of an optical system is quickly and easily obtained in a single acquisition step by obtaining image data within a volume of image space. A reticle and image plane are positioned obliquely with respect to each other such that a reticle having a plurality of feature sets thereon, including periodic patterns or gratings, is imaged in a volume of space, including the depth of focus. Metrology tools are used to analyze the detected or recorded image in the volume of space through the depth of focus in a single step or exposure to determine the imaging characteristics of an optical system. Focus, field curvature, astigmatism, spherical, coma, and/or focal plane deviations may be determined. The present invention is particularly applicable to semiconductor manufacturing and photolithographic techniques used therein, and is able to quickly characterize an optical system in a single exposure with dramatically increased data quality and continuous coverage of the full parameter space.

18 Claims, 15 Drawing Sheets

U.S. PATENT DOCUMENTS

| 6,368,763 B1 | 4/2002 | Dirksen et al. |
|---|---|---|
| 2002/0021460 A1 | 2/2002 | Hansen |
| 2004/0001192 A1 | 1/2004 | Lyons et al. |

FOREIGN PATENT DOCUMENTS

| JP | 3-235319 | 10/1991 |
|---|---|---|
| WO | WO 98/21629 A | 5/1998 |
| WO | WO 98/21629 A2 | 5/1998 |
| WO | WO 98/21629 A3 | 5/1998 |

OTHER PUBLICATIONS

English-language Patent Abstract of JP 03-235319, published Oct. 21, 1991, 1 page.

European Application No. 00 112 970.9, European Communication, Nov. 3, 2004, 5 pages.

U.S. Appl. No. 09/339,506, filed Jun. 24, 1999, Hansen.

U.S. Appl. No. 10/972,170, filed Oct. 25, 2004, Hansen.

Communication from European Patent Application No. 01957171.0, dated Apr. 16, 2003, 4 pages.

International Search Report from PCT Appl. No. PCT/US01/22518, dated Jan. 11, 2002, 4 pages.

Copy of European Search Report for European Appln. 00112970.9 mailed Apr. 14, 2004.

J.P. Kirk and C.J. Progler, "Application of Blazed Gratings for Determination of Equivalent Primary Azimuthal Aberrations", Mar. 1999, Optical Microlithography XII, vol. 3679, pp. 70-76.

* cited by examiner

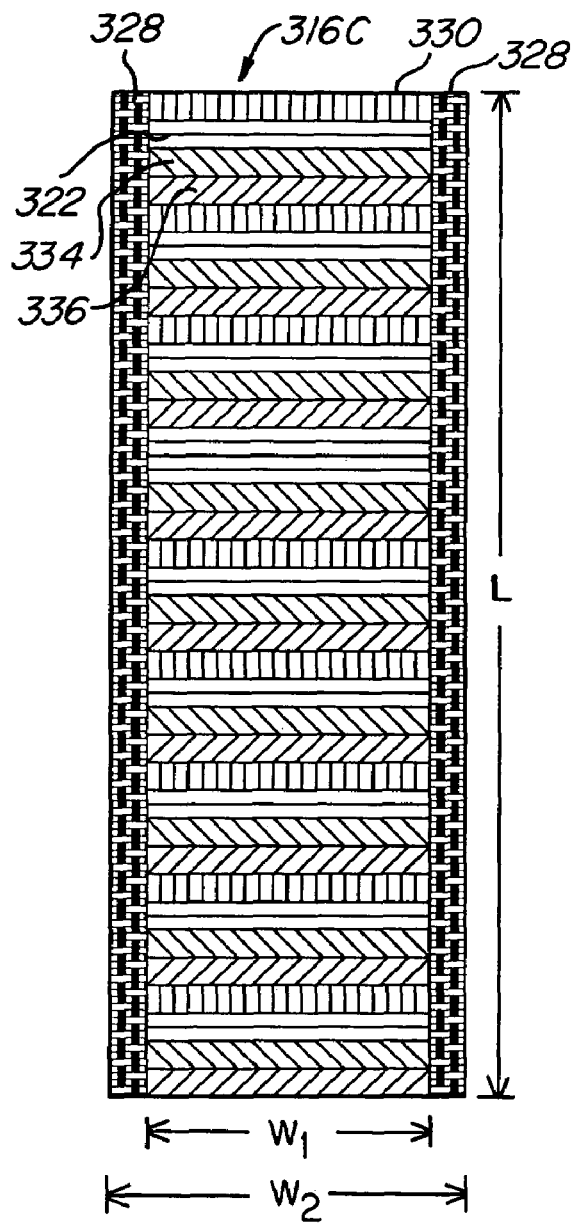
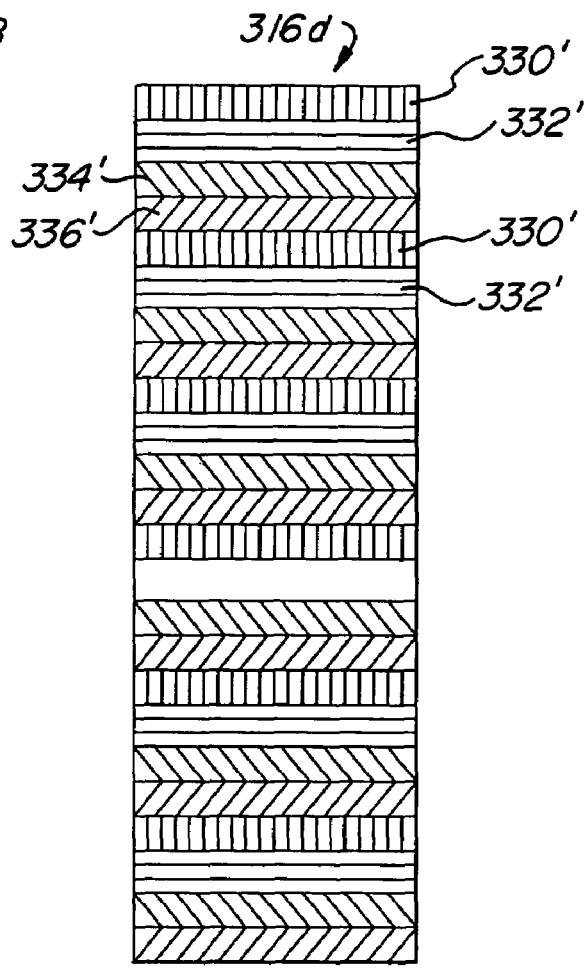
FIG. 5A
FIG. 5B

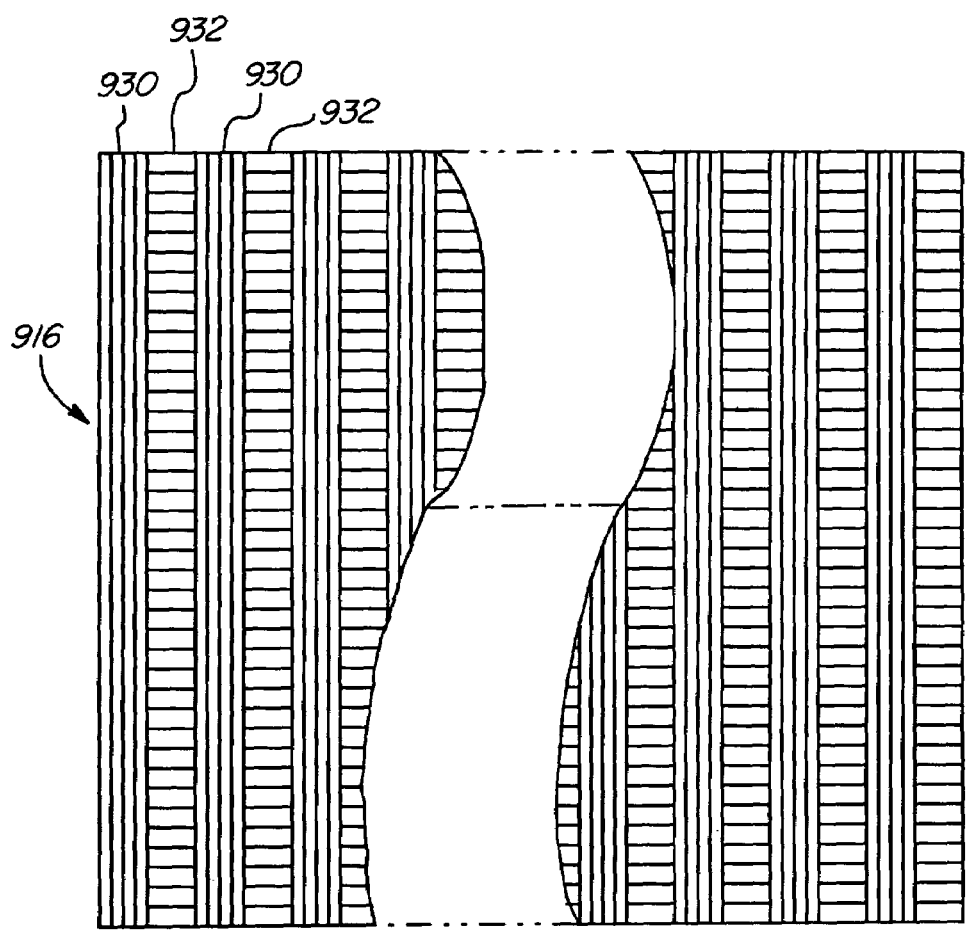
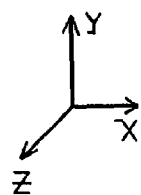
FIG. 11A
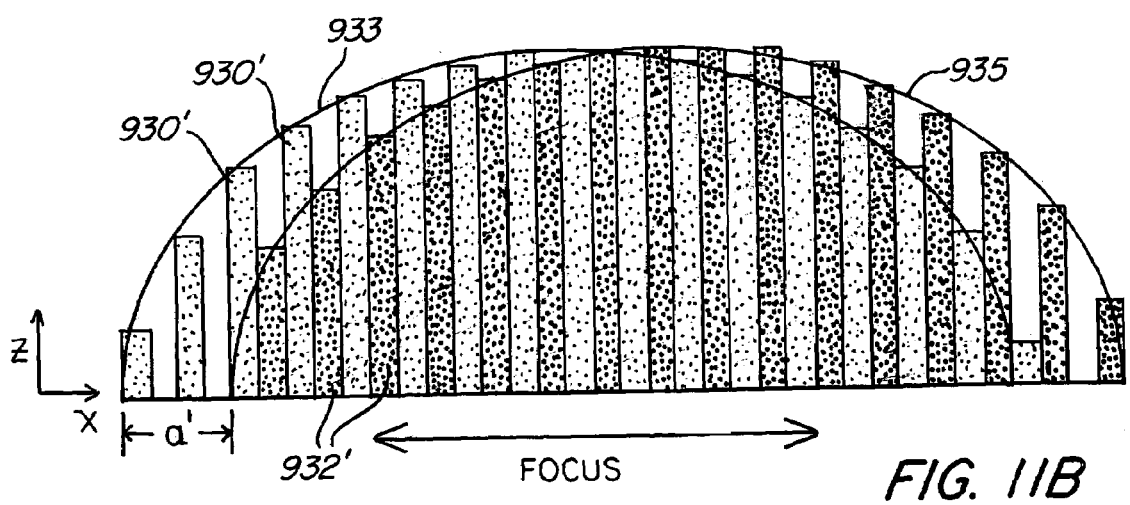
FIG. 11B

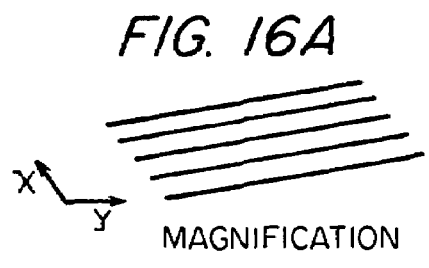
FIG. 16A MAGNIFICATION
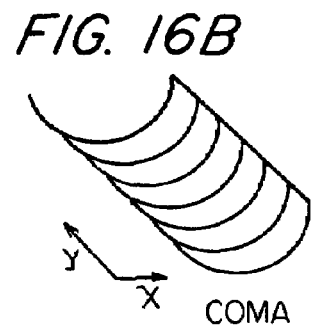
FIG. 16B COMA
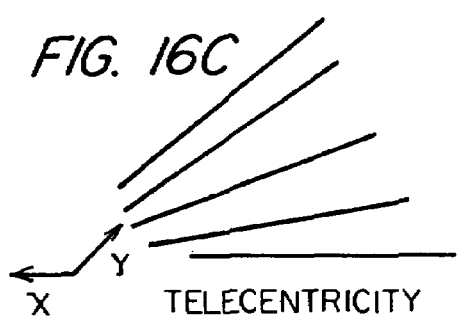
FIG. 16C TELECENTRICITY
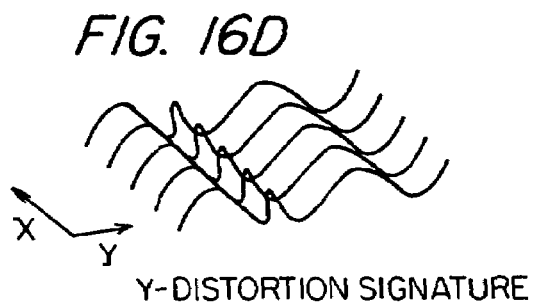
FIG. 16D Y-DISTORTION SIGNATURE
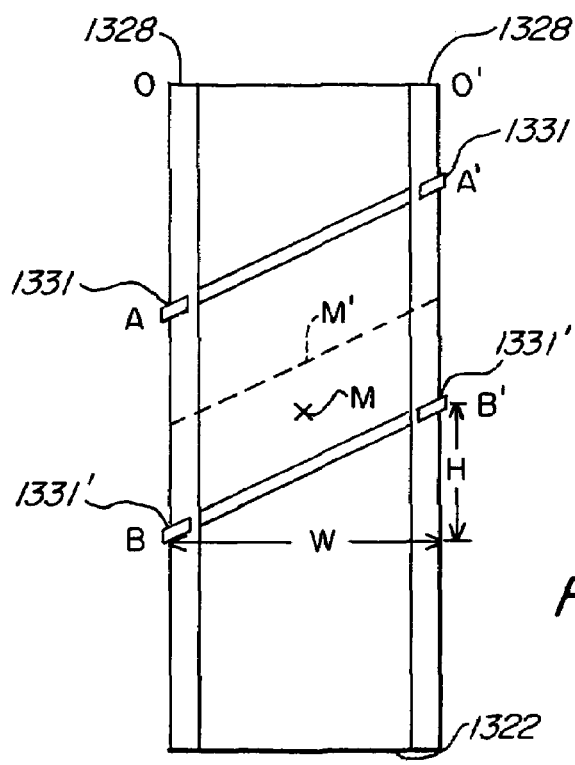
FIG. 17

METHOD AND APPARATUS FOR CHARACTERIZATION OF OPTICAL SYSTEMS

CROSS REFERENCE TO RELATED APPLICATIONS

The application is a continuation of U.S. Ser. No. 09/339,506, filed Jun. 24, 1999, entitled "Method And Apparatus For Characterization Of Optical Systems," which is incorporated by reference herein in its entirety.

BACKGROUND OF THE INVENTION

1. Field of the Invention

The present invention relates in general to determining image data of an optical system, and particularly to the rapid and precise characterization of an optical system including focus, field curvature, astigmatism, spherical, coma, and/or focal plane deviation.

2. Background Art

Photolithography is often used in the manufacture of semiconductor devices and other electronic equipment. In photolithography, projection optics of high quality are often used to image features on a reticle onto a photosensitive substrate, such as a resist covered wafer. As the feature sizes desirable to be reproduced become ever smaller, the optical system or projection optics must be continually maintained and checked for image quality. Often, the performance of an optical system or projection optics is difficult to obtain without time consuming techniques. Generally, multiple exposures are required of a photosensitive substrate at different locations in the image field and at different focus depths to characterize the optical system. The optical system is then characterization by compiling information obtained from examining the multiple processed images. Each of the many exposures and the corresponding processed images are acquired serially. Consequently, focus errors, scan errors and temporal variations to the optical system parameters during the measurement are compounded. In the case of scan and focus errors, noise is introduced into the data. In the case of temporal variations, valid data are unrecoverable. Additionally, the data are discretely sampled rather than continuous across the parameter range. Consequently, quantization errors result from estimation of data values that lie between adjacent samples. With demand for increasing production throughput and increasing performance requirements of the projection optics capable of imaging reduced feature size, there is a need for improving the apparatus and methods used to characterize an optical system. There is a need to develop an apparatus and method that will quickly and easily provide high-precision data or information that can be used to characterize the performance of an optical system quickly and easily and with data obtained simultaneously and processed simultaneously without the need to perform multiple exposures and processing of multiple images.

SUMMARY OF THE INVENTION

The present invention comprises a method and apparatus for obtaining optical system characterization information simultaneously by utilizing a volume of space during a relatively short time or in a single exposure. A test reticle having a plurality of features with different orientations, sizes, and line types is imaged with the optical system being characterized. Either the object plane in which the reticle is positioned or the image plane in which the characterization data is obtained is tilted or angled within the corresponding three-dimensional volume of space. The reticle, having a plurality of features, is imaged with the optical system being characterized. In a volume of space, through a depth of focus, an envelope of feature quality through focus is thereby obtained. This envelope of feature quality is simultaneously obtained by acquiring image data of the reticle in a plane that is oblique to the reticle plane. The resulting image of the reticle and corresponding features are analyzed with metrology techniques, which may include an interferometric tool thereby obtaining optical system characteristics. The optical system characteristics that may be obtained include focus, field curvature, astigmatism, coma, distortion, telecentricity and/or focal plane deviation, as well as information on spherical aberrations and variation of coherence.

Accordingly, it is an object of the present invention to obtain, extract, and analyze optical system characterization information quickly and in a single exposure or imaging operation.

It is an advantage of the present invention that it results in a rapid acquisition of data required for characterization of an optical system.

It is another advantage of the present invention that it results in rapid acquisition of data desensitized to the focus, scan, and temporal errors associated with prior techniques.

It is a feature of the present invention that information or data is obtained throughout a volume of image space.

It is another feature of the present invention that the reticle is in a different plane than the plane from which data is acquired in image space.

It is yet another feature of the present invention that the perpendicular from the reticle and/or image plane interceptor be non-collinear with the axis of the optical system.

These and other objects, advantages, and features will be readily apparent in view of the following detailed description.

BRIEF DESCRIPTION OF THE DRAWINGS

FIG. 5A is a plan view illustrating one type of grating or periodic pattern or structure.

FIG. 5B is a plan view illustrating another type of grating or periodic pattern or structure.

FIG. 11A is a schematic plan view of another embodiment of a portion of a pattern on a reticle.

FIG. 11B is a schematic perspective view illustrating detection of astigmatism based upon the embodiment illustrated in FIG. 11A.

FIG. 16A-D graphically illustrate in perspective the different distortions or aberrations illustrated in FIG. 15.

FIG. 17 is a plan view of a photosensitive substrate illustrating an embodiment of the present invention used to obtain best focus of an optical system.

DETAILED DESCRIPTION OF THE PREFERRED EMBODIMENTS

Figure 1:
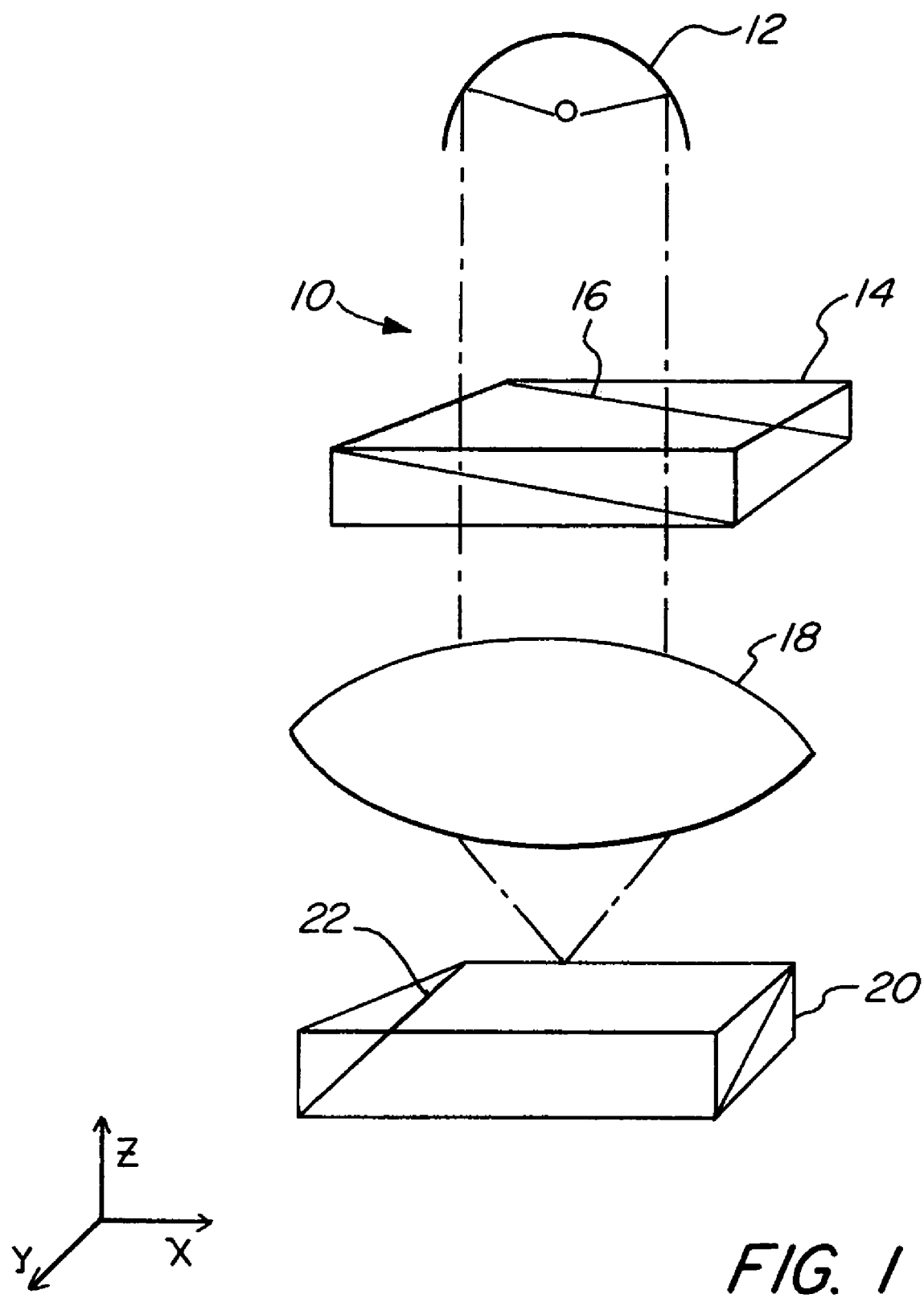
FIG. 1 is a schematic illustration of a photolithographic system.

FIG. 1 schematically illustrates the present invention. A photolithographic system 10 is generally illustrated. An illumination source 12 is used to project the image of a reticle 16 within a reticle or object space or volume 14 onto a photosensitive substrate 22 within a photosensitive substrate or image space 20 through optical system or projection optics 18. The reticle 16 is positioned within a plane that is oblique with respect to the photosensitive substrate 22. The reticle 16 and the photosensitive substrate 22 may be tilted in a variety of different ways. Preferably, the positioning of the reticle 16 or the wafer 22 is such that either the reticle 16 or wafer 22 extends through the object volume or depth of focus of the optical system or projection optics 18. The imaging data recorded by the photosensitive substrate 22 provides information permitting the characterization of the optical system or projection optics 18. Imaging characteristics such as focus, field curvature, astigmatism, coma, and/or focal plane deviation, as well as information for determining spherical aberration and variation of coherence may be obtained. The image quality of the entire image field through focus may be obtained in a single imaging or exposure operation in a relatively short time. The entire image of the reticle may be analyzed with metrology techniques for characterizing the optical system or projection optics 18. The optical system or projection optics 18 is thereby characterized in the x and y field direction as well as the depth of focus in the z direction. While a photosensitive substrate 22 has been indicated as a way to record the electromagnetic radiation passing through the reticle 16, any devise for detecting electromagnetic radiation may be uses, for example a photoreceptive sensor, such as a charge coupled device (CCD) array, position sensitive detector (PSD), or equivalent detector.

Figure 2:
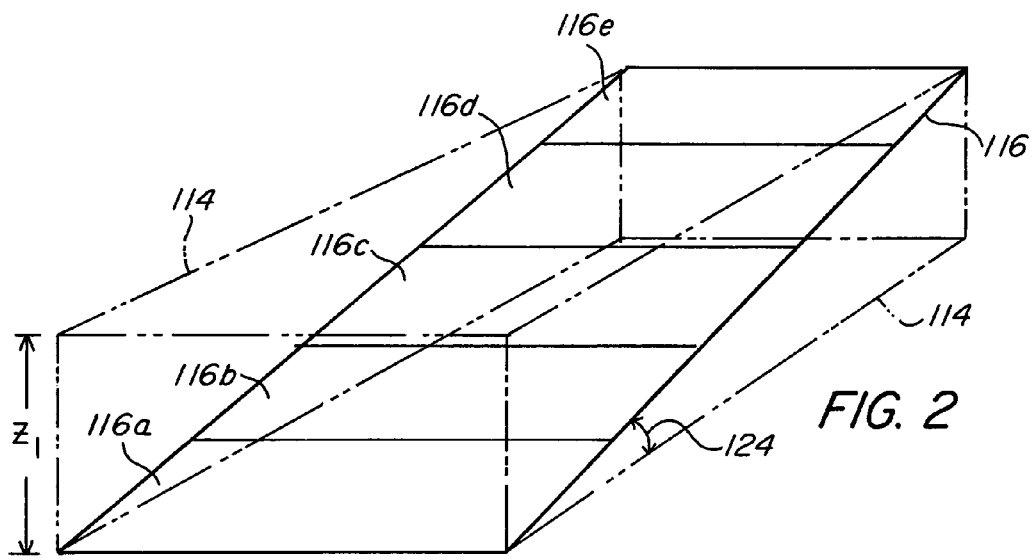
FIG. 2 is a perspective view of the reticle or object space.

FIG. 2 illustrates an object space or reticle space 114. Placed within the object or reticle space 114 is a reticle 116 comprised of a plurality of different periodic features 116a, 116b, 116c, 116d, and 116e. Each of the plurality of different periodic patterns or features 116a, 116b, 116c, 116d, 116e may contain a grating pattern of varying line types, shapes, sizes, and orientations for obtaining different imaging information or data for characterizing the optical system. The periodic features or structures need only be periodic and need not be gratings. The reticle 116 may be tilted within the object or reticle space 114 by an angle 124. Accordingly, the reticle 116 is positioned within the reticle or object space 114 over a range of depth $z_1$.

Figure 3:
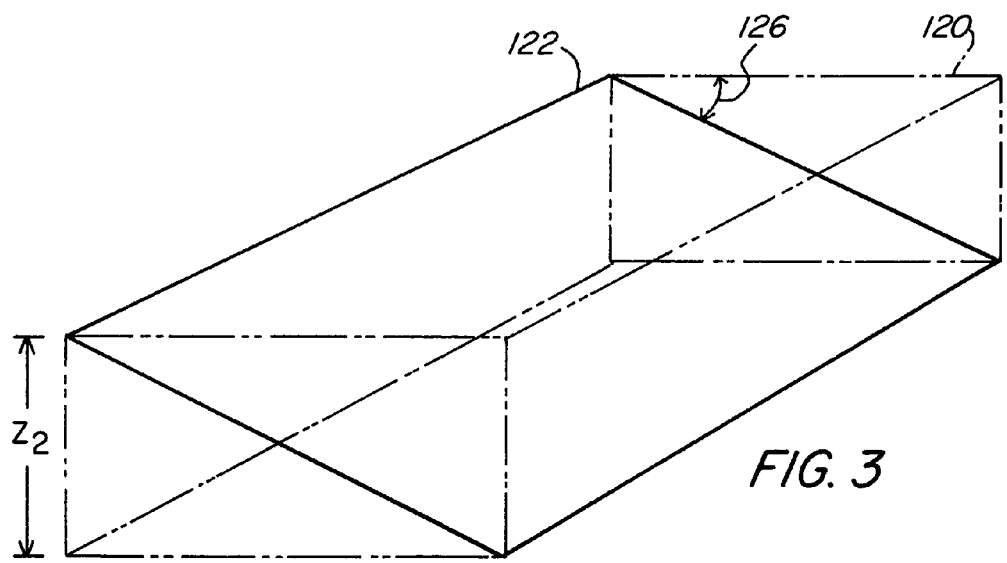
FIG. 3 is a perspective view of the photosensitive substrate or image space.

FIG. 3 is a perspective view illustrating a photosensitive substrate 122 angularly positioned in a data acquisition plane of the photosensitive substrate image or space 120. The photosensitive substrate 122 is positioned at an angle 126 within the photosensitive substrate or image space 120. The photosensitive substrate 122 extends through a range of depth $z_2$. This range of depth $z_2$ is within the depth of focus of the optical system or projection optics. The photosensitive substrate 122 is illustrated tilted at angle 126 that is compound to the angle of tilt 124 of the reticle 116, illustrated in FIG. 2. It should be appreciated that the reticle 116 and the photosensitive substrate 122 may be angled or tilted in different ways with respect to each other and the tilts illustrated in FIGS. 2 and 3 are only illustrative of the possible tilt or angle which may be utilized in the present invention. In obtaining useful characterization data for an optical system according to the teachings of the present invention, it may only be necessary to have one plane oblique with respect to the other plane, with the degree and nature of the oblique positioning of the two planes determined solely by the type and quantity of characterizing data desired. For example, the plane of the reticle need not be tilted, while the plane of the photosensitive substrate is tilted or made oblique to that of the plane of the reticle.

Figure 4:
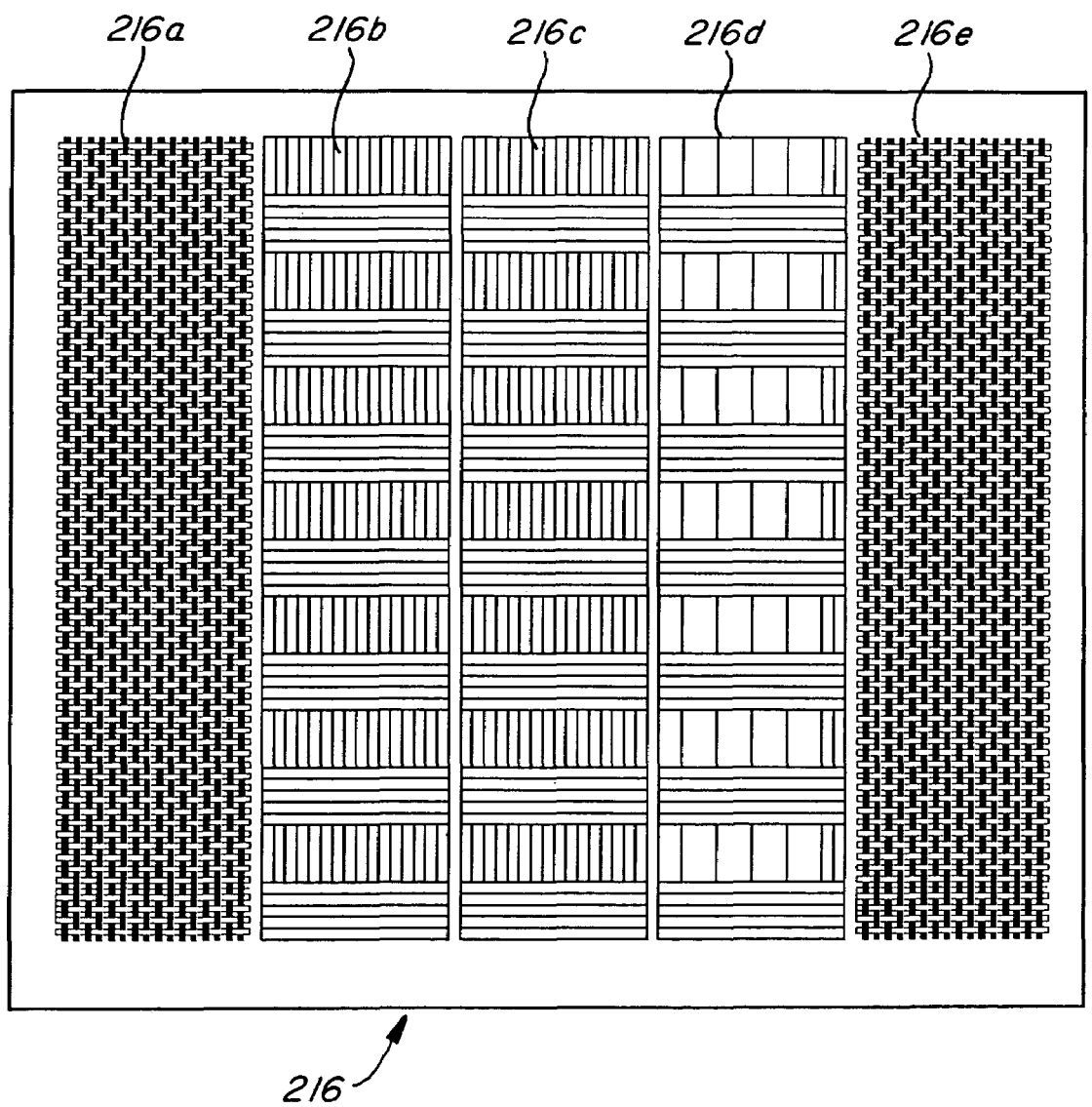
FIG. 4 is a plan view illustrating a test reticle having a plurality of periodic structures or patterns thereon.

FIG. 4 is a plan view illustrating a reticle 216 having a plurality of different periodic features, patterns, structures or gratings thereon. The different periodic features may be grouped forming different feature sets which may be used to obtain different imaging information for characterizing the optical system. For example, reticle 216 may be comprised of a plurality of different line types, shapes, sizes, and orientations that may made up of four feature sets. For example, a first feature set 216a comprising a basket weave, a second feature set 216b comprising a plurality of horizontal and vertical lines, a third feature set 216c comprising a plurality of horizontal and vertical lines having different spacing or sizing relative to the second feature set 216b, a third feature set 216d comprising a different set of horizontal and vertical lines, and a fourth feature set 216e comprising a basket weave, which may be the same or different than the first feature set 216a. The reticle 216 comprises a plurality of different feature sets, which may include different lines and spacing or gratings over the entire image field for imaging onto an oblique plane within the object space. The detection and analyzing of the image in a plane traversing the image space results in the acquisition of optical system characterization data which may be utilized to determine the performance or imaging characterizations of the optical system.

FIG. 5A is an example of another feature set 316c which may be placed on a portion of a reticle and imaged onto a photosensitive substrate. The feature set 316c may be comprised of a central field having width $w_1$ that is comprised of multiplex or interlaced rows or stripes forming a pattern. For example, row 330 has spaced vertical lines thereon, row 332 has spaced horizontal lines thereon, row 334 has spaced negative 45° tilted lines thereon, and row 336 has positive 45° tilted lines thereon. The stripes or rows 330, 332, 334, and 336 may form a pattern extending along the length L of the feature set 316C formed on a portion of a reticle, as illustrated in FIG. 5A. The edges of the feature set 316c may be formed from a column or a vertical stripe 328. Formed within columns 328 is a basket weave pattern. The basket weave in columns 328 may be formed from partially transmissive sections or portions. The entire width of the feature set 316c is $W_2$. By way of example, the feature set 316c may have dimensions of approximately 27 mm in length L with the total width $W_2$ of approximately 5 mm and the center width $W_1$ being approximately 4.5 mm. Each row or stripe may be approximately 50 microns high or wide. Each line width within the row may be in the order of 200 nanometers. The feature set illustrated in 316c is given only by way of an example. Other feature sets may be utilized that are well known and used by those skilled in the art to determine the characteristics of an optical system.

FIG. 5B illustrates another feature set 316d which may be utilized on a portion of a reticle. Feature set 316b comprises a pattern of horizontal, vertical and angled lines. Stripe or row 330' has a vertical line pattern thereon. Row or stripe 332' has a plurality of horizontally spaced lines thereon. Row or stripe 334' has a plurality of lines tilted negative 45° and row or stripe 336' has a plurality of lines tilted positive 45° thereon. The plurality of rows or stripes are repeated in a horizontal, vertical, negative 45°, positive 45° pattern along the length of the feature set 316d. Other rows or patterns may be placed within a feature set depending upon the characteristic of the optical system desired to be detected or determined.

Figure 6:
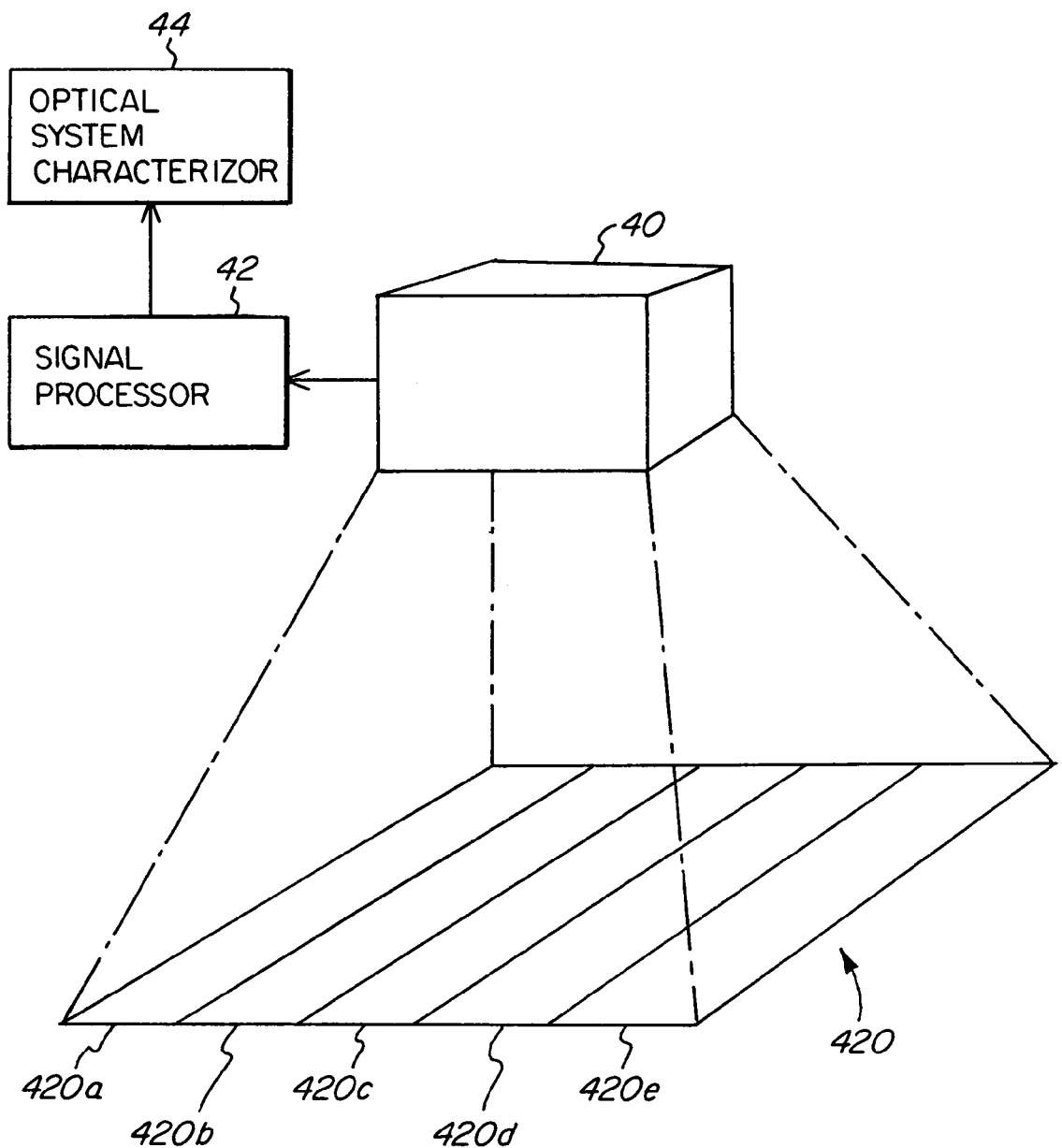
FIG. 6 schematically illustrates the acquisition of data used to characterize an optical system.

FIG. 6 illustrates the processing of information obtained from the imaging of the reticle with the optical system or projection optics to be characterized. An image plane 420 is detected or recorded onto a photosensitive substrate. The image plane has a plurality of images composed of the feature set images 420a, 420b, 420c, 420d and 420e imaged by a reticle, such as that illustrated in FIG. 4. Data obtained from the image plane 420, which is positioned obliquely to the reticle plane, is extracted over the entire image field plane, which is preferably recorded onto a photosensitive substrate, by a metrological tool 40, which is preferably an interferometer. The metrological tool 40 may detect or extract information, such as interference patterns, determined or detected from the image of the feature sets on the reticle. The images are formed on the image plane 420 and may be recorded on a photosensitive substrate. Signal processor 42, coupled to the metrological tool 40, analyzes and processes the different images of the different feature sets 420a, 420b, 420c, 420d and 420e. The processed signals from the signal processor 42 are provided to an optical system characterizor 44. Different aberrations of the optical system may therefore be determined. For example, astigmatism may be determined as a function of periodic pattern or grating orientation. Coma may be determined as a function of second order distortion signature versus focus. Spherical aberration may be determined as a function of best focus difference between line sizes versus field position. The recorded data may be analyzed by different metrology tools, such as white light, a dark field microscope, a large aperture interferometer, a laser microscope interferometer, or a interferometric microscope, for example.

Figure 7:
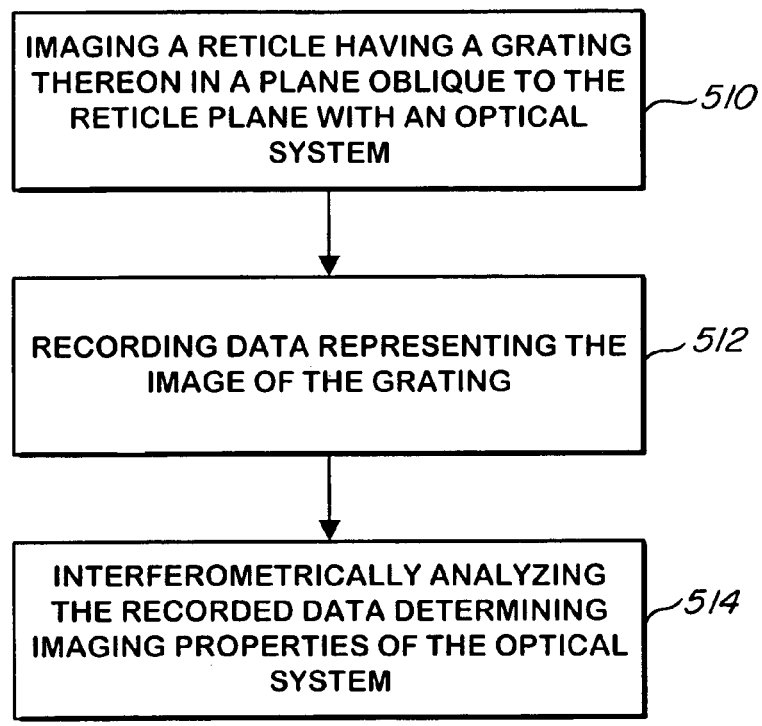
FIG. 7 is a block diagram illustrating the method steps of the present invention.

FIG. 7 is a block diagram illustrating the method steps of the present invention. Block 510 represents the step of imaging a reticle having a periodic grating or pattern thereon in a plane oblique to the reticle plane with an optical system being characterized. The periodic pattern may be comprised of different grating patterns, with each different grating pattern designed to determine a predetermined characteristic or property of the optical system. Block 512 represents the step of recording data representing the image of the periodic pattern or grating detected in the plane oblique to the reticle plane. The image of the periodic pattern or grating may be recorded with a photosensitive substrate, or recorded by electronic means. Block 514 represents the step of interferometrically analyzing the recorded data to determine the imaging properties of the optical system. The data representing the periodic pattern, grating or gratings is analyzed with interferometric techniques to obtain the properties of the optical system. The optical system can be characterized over the entire field and at different depths of focus in a single operation.

FIGS. 8–13 illustrate the application of the concepts of the present invention to different embodiments for characterizing an optical system by determining different optical properties, such as field curvature and different aberrations, including astigmatism and spherical aberrations.

Figure 8A:
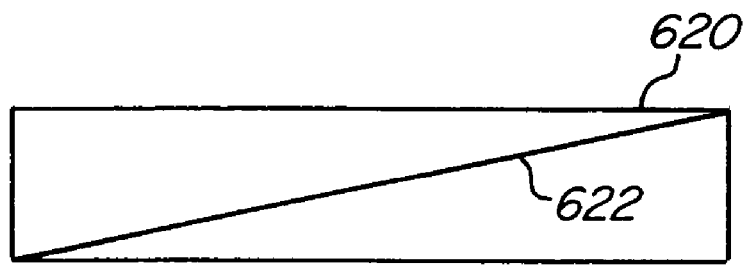
FIG. 8A schematically illustrates a volume of space.

FIG. 8A a volume of space 620. Within the volume of space 620, electromagnetic radiation representing images may be detected. For example, generally a photosensitive substrate 622 is positioned within the volume of space 620 at an angle. An image from an optical system, not shown, is projected onto the photosensitive substrate 622. The image projected onto the photosensitive substrate 622 is that of a plurality of feature sets or spaced lines placed on a reticle, as illustrated in the prior figures. The use of a photosensitive substrate 622 is illustrative of the preferred embodiment, however, it should be appreciated that any photo receptor may be placed in the volume of space 620 to receive and detect the electromagnetic radiation representing an image of the reticle.

Figure 8B:
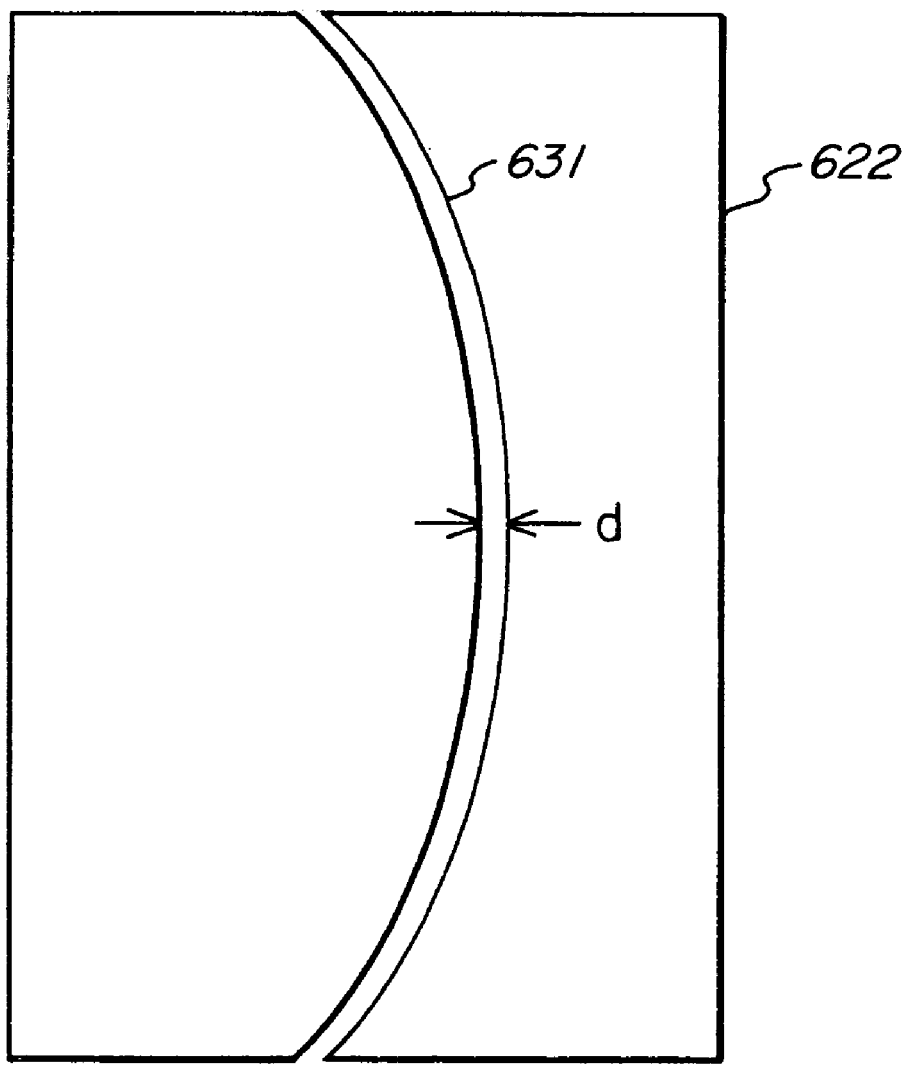
FIG. 8B is a schematic plan view of an image formed on a photosensitive substrate.

FIG. 8B illustrates the detection of field curvature utilizing a photosensitive substrate 622 positioned as illustrated in FIG. 8A. Line 631 represents the field curvature for the optical system being characterized and the width d of line 631 represents the depth of focus of the optical system being characterized. Accordingly, by tilting a photosensitive substrate 622 within a volume of space 620 and using a reticle having a plurality of features which are imaged onto the photosensitive substrate, the field curvature and depth of field can quickly and easily be determined. By selecting the appropriate features and orientations on a reticle, additional information characterizing the optical system can be obtained in a single exposure of a photosensitive substrate or single data acquisition of the receipt of electromagnetic radiation within the volume of space.

The line 631 may be created with a periodic pattern or grating reticle imaged on a tilted photosensitive substrate 622 or a photosensitive substrate having a bow. A periodic pattern or grating strip or line 631 will be produced down the center of the field. The line 631 should be calculated to be narrow enough to define the central strip of the field, but wide enough to include several resolvable points in the horizontal direction. This is a function of the pixel density of the detector array, CCD, or PSD used to view the strip or line 631. A phase-shifting interferometer may be used. Data may be obtained by positioning the photosensitive substrate 622 at the Littrow angle with respect to the phase-shifting interferometer. The Littrow angle is the angle at which electromagnetic radiation from the interferometer retro-diffracts to return to the interferometer. The peaks of an intensity map acquired by the phase-shifting interferometer are the points of best focus of the optical system being characterized. These peaks comprise a ridge in the vertical direction. The meandering of this ridge laterally as the field is traversed from top to bottom represents the field curvature. The robustness of this procedure relies on the acquisition of the intensity data in parallel. Calibration, scaling, and extraction of data are straightforward. This method uses the intensity of the retro-diffraction. Field curvature may also be detected using the phase of the retro-reflection. In this method the photosensitive substrate is positioned perpendicular to the phase-shifting interferometer axis. The acquired phase map consist of the feature resist height at each point on the photosensitive substrate. From left to right, is the quality of feature as a function of focus curve. From top to bottom is the shift of best focus for any feature size and orientation as a function of field position. The field curvature and astigmatism can be extracted from the comparison of curve shift as a function of orthogonal feature orientation.

Figures 9A, 9B:
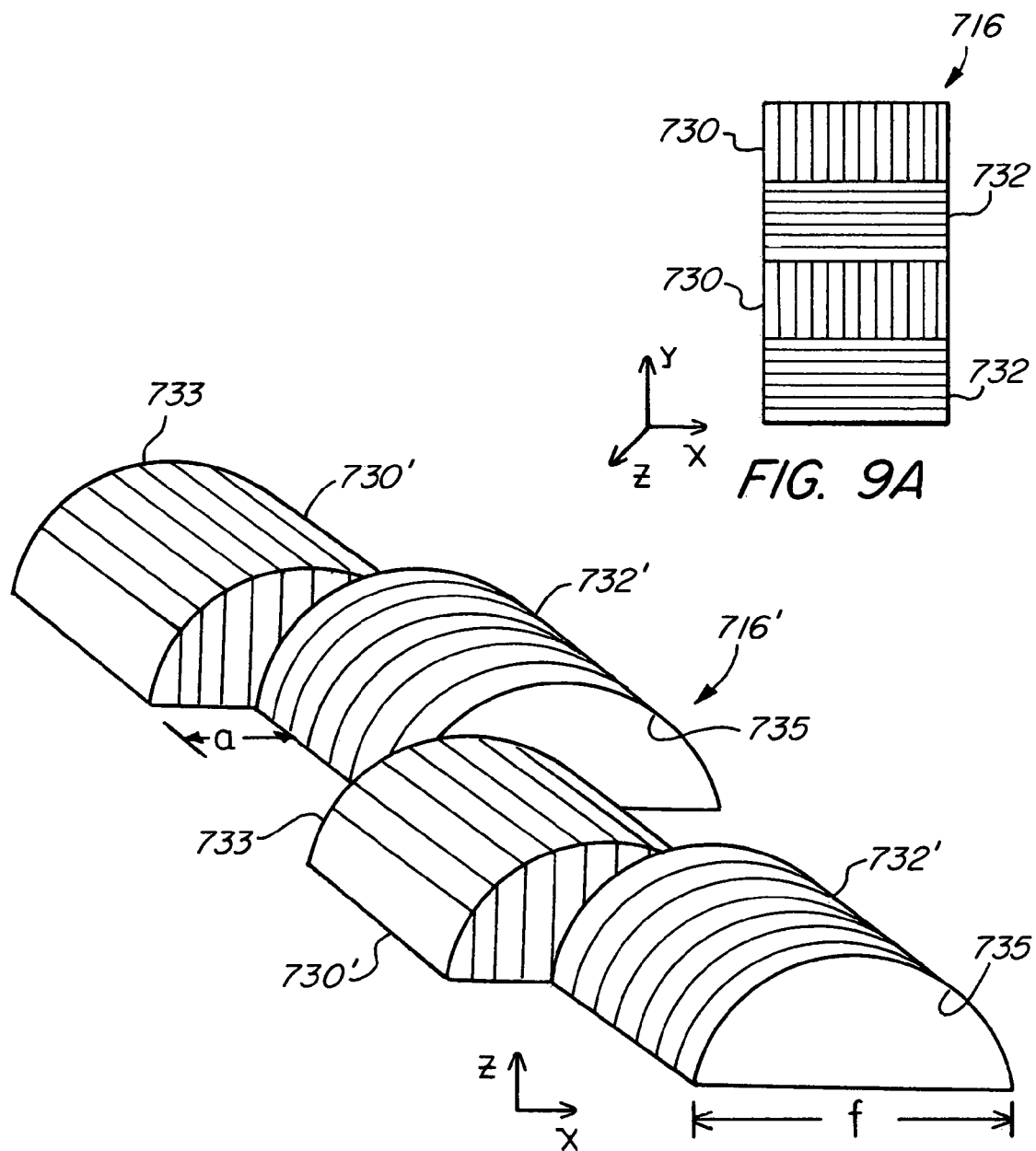
FIG. 9A is a schematic plan view of one embodiment of a portion of a pattern on a reticle.
FIG. 9B is a schematic perspective view illustrating detection of astigmatism based upon the embodiment illustrated in FIG. 9A.

FIGS. 9A and 9B schematically represent detection of astigmatism according to the present invention. FIG. 9A schematically represents a pattern which may be repetitively reproduced on a reticle or a mask for use in detecting astigmatism. Portion 716 contains orthogonal gratings or line patterns. Vertical lines 730 are interlaced or alternate between horizontal lines 732. The vertical lines 730 and the horizontal lines 732 are mutually perpendicular with respect to each other.

FIG. 9B represents the image formed on a photosensitive substrate that has been tilted in the volume of space, such as that illustrated in FIG. 8A. The feature set or portion of the periodic patterns or gratings 716 imaged on the photosensitive substrate has a lateral dimension f representing the depth of field. Across the dimension f, representative of the depth of field, different image quality will be obtained with the best image quality being located at the highest point along dimension f. An envelope 735 is formed. The envelope 735 represents the image quality in a dimension F along the depth of focus of the recorded image 732' of the horizontal line 732 illustrated in FIG. 9A. Similarly, the vertical lines 730 illustrated in FIG. 9A are represented by recorded image 730'. An envelope 733 is formed representing the image quality of the depth of focus for the recorded image 730' of the vertical lines 730 on the portion 716 of a reticle, illustrated in FIG. 9A. The best image quality being graphically represented by the highest point along the envelopes 733 and 735. Any astigmatism in the optical system at the image location is represented by distance a, which represents the different imaging of the horizontal and vertical lines. The axial separation of the tangential and sagittal image planes can be detected by the different points of focus represented by the envelopes 733 and 735. The lateral shift of these different points of focus is represented by distance a.

Figure 10B:
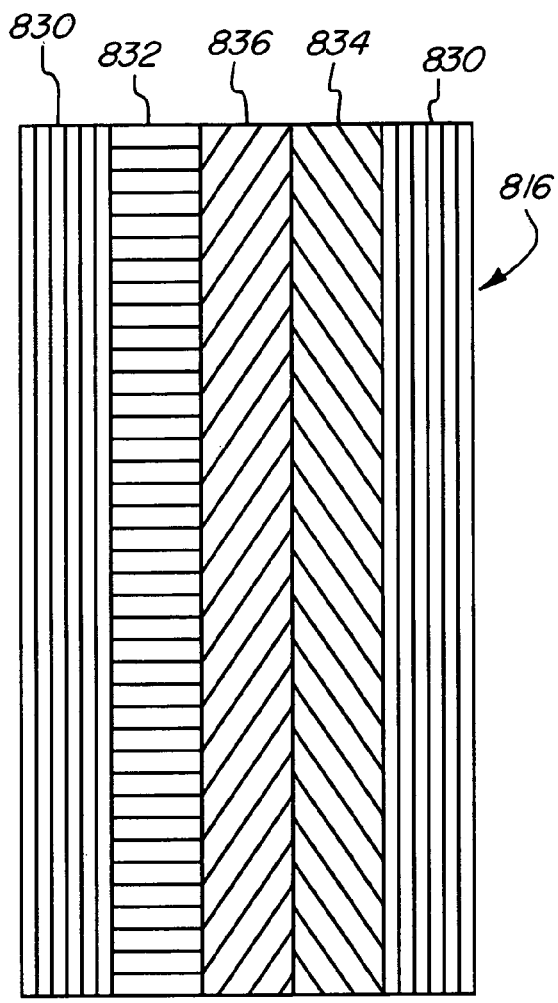
FIG. 10B is a schematic plan view illustration a portion of a reticle pattern.
Figure 10A:
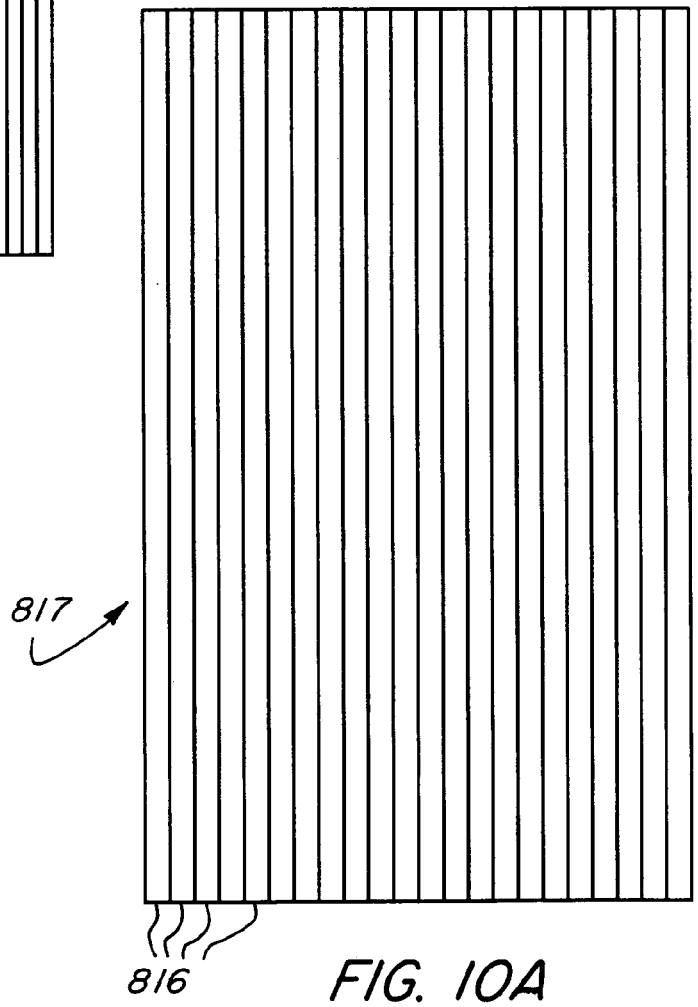
FIG. 10A is a schematic plan view illustrating a reticle.

Many different feature sets or periodic patterns or gratings may be utilized according to the present invention. FIGS. 10A and 10B illustrate another feature set, periodic pattern, or grating that may be utilized in determining astigmatism of an optical system. FIG. 10A is a plan view illustrating a reticle or mask 817 having a plurality of stripes 816, each strip 816 containing a reticle pattern or feature set. FIG. 10B schematically illustrates one of the reticle periodic patterns or gratings 816 from which the reticle 817 illustrated in FIG. 10A is formed. The feature set, periodic pattern or grating 816 is formed from a plurality of columns of periodic patterns or gratings. The columns of periodic patterns or gratings are formed from pairs of orthogonal lines. For example, column 830 is formed from vertical lines and column 832 is formed from horizontal lines. The horizontal and vertical lines are orthogonal. Column 836 is formed from a +45° tilted line and column 834 is formed from a −45° tilted line. Therefore, the lines in columns 836 and 834 are orthogonal. The interlacing of columns having different line orientations, as is illustrated in FIG. 10B, provides information as to the aberrations in the optical system being characterized. The aberrations in a substantial portion of the field can be detected simultaneously in practicing the present invention.

FIGS. 11A and 11B are simplified schematic representations illustrating this embodiment of the present invention. In this embodiment of the present invention, lines or feature sets are arranged in columns rather than rows. FIG. 11A illustrates a plan view of a portion of a reticle pattern 916. The reticle pattern is formed from a plurality of feature sets or lines a portion of which is formed by columns of lines that alternate between horizontal and vertical orientations. Columns 930 are formed from a plurality of vertical lines and columns 932 are formed from a plurality of horizontal lines. The image formed from portion 916 of a reticle, when projected in image space, may be used to detect astigmatism. In this embodiment, a photosensitive substrate utilized to record the image of the reticle portion 916 is tilted with respect to the reticle portion 916 out of the X-Y plane and rotated about the Y axes. FIG. 1B schematically represents the detection and analysis of the image in the image space to determine astigmatism at the field location. Because the photosensitive substrate on which the image is recorded is tilted out of the X-Y plane and rotated about the Y axes, the X direction represents the depth of focus, as illustrated in FIG. 1B. The height in the Z direction, illustrated by FIG. 11B, represents the image quality at a different depth of focus. Bars 930', in FIG. 11B, represent the image quality of the alternating columns 930 of vertical lines illustrated in FIG. 11A. The image quality increases and decreases along the depth of focus with the optimum image quality being somewhat centrally located. Accordingly, an envelope 933 is formed representing the image quality of the columns 930 of vertical lines. Similarly illustrated in FIG. 11B, the image quality of columns 932 of horizontal lines is represented by bars 932', with the height of the bars 932' in the z direction representing image quality. The image quality increases and decreases along the depth of focus in the X direction. Accordingly, an envelope 935 of the bars 932' may be determined representing the image quality of the columns 932 of horizontal lines on the reticle portion 916, illustrated in FIG. 11A. The image of the columns 930 of vertical lines represented by bars 930' are interlaced between the image of the columns 932 of horizontal lines represented by bars 932'. If there is no astigmatism at the field location of the optical system being characterized, the envelopes 933 and 935 will coincide. However, any astigmatism may be detected by a shift in the envelopes 933 and 935, represented by distance a'.

FIGS. 9A and 9B and FIGS. 11A and 11B illustrate different techniques to obtain the same information using different embodiments of the present invention. The teachings of the present invention, in simultaneously imaging a plurality of different feature sets, periodic patterns, or gratings on a reticle and recording the resulting images in a volume of space, makes possible the detection and characterization of aberrations of the optical system in a single step or exposure. The teachings of the present invention may be utilized to determine different aberrations in the optical system depending upon the different feature sets, periodic patterns, or gratings utilized on portions of the reticle.

Figure 12:
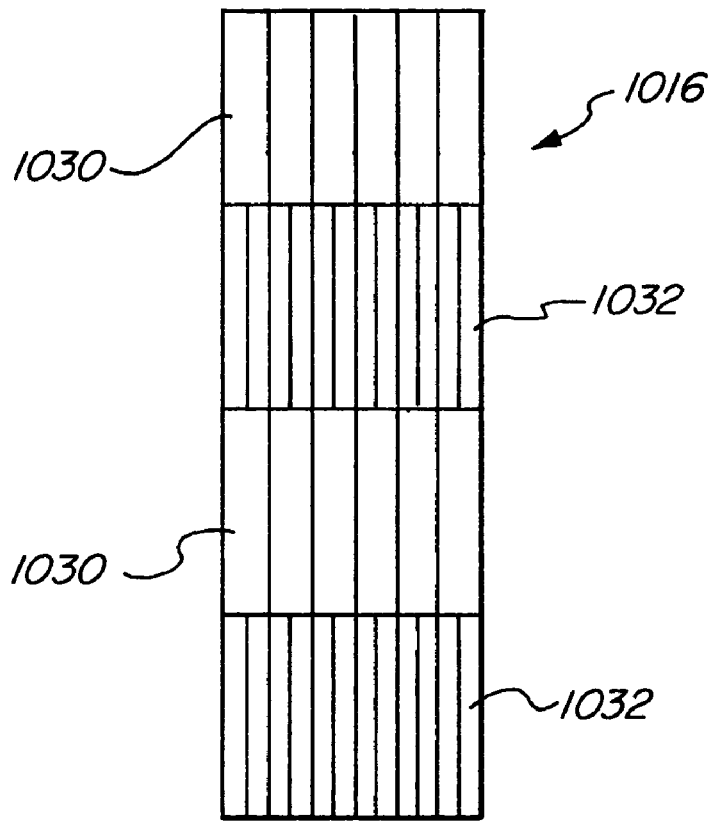
FIG. 12 is a schematic plan view illustrating a portion of a reticle pattern utilized in detecting spherical aberrations.

FIG. 12 illustrates a portion of a reticle 1016 having a feature set or line pattern that may be utilized to detect spherical aberrations. The reticle portion 1016 represents rows 1030 and 1032 of alternating lines with different line spacing or width. For example, the line spacing of row 1030 may be 300 nanometers and the line spacing of row 1032 may be 100 nanometers. The reticle pattern portion 1016 illustrated in FIG. 12 is analogous to the reticle pattern portion 716 illustrated in FIG. 9A. However, where the reticle pattern portion 716 utilizes line orientation to detect astigmatism, the reticle pattern portion 1016 utilizes line width or spacing to detect spherical aberrations. All detect the image of the respective reticle pattern portion in a volume of space at different depths of focus, such as when a photosensitive substrate is tilted in the image volume of space. Additionally, all may be read with an interferometer in a single step with the different imaged lines containing information representative of the aberrations of the optical system. For the reticle pattern portion 1016, the image quality will vary along the depth of focus for the different line widths. Accordingly, an envelope representing the image quality as a function of the depth of focus for each different line width section will shift depending upon any spherical aberrations. It should be appreciated that different reticle portions may be utilized having different line patterns over portions of the reticle to detect a variety of different aberrations at different locations in the field. These different portions of reticle patterns may be incorporated in a single reticle to simultaneously detect and measure the field curvature and different aberrations.

Figure 13:
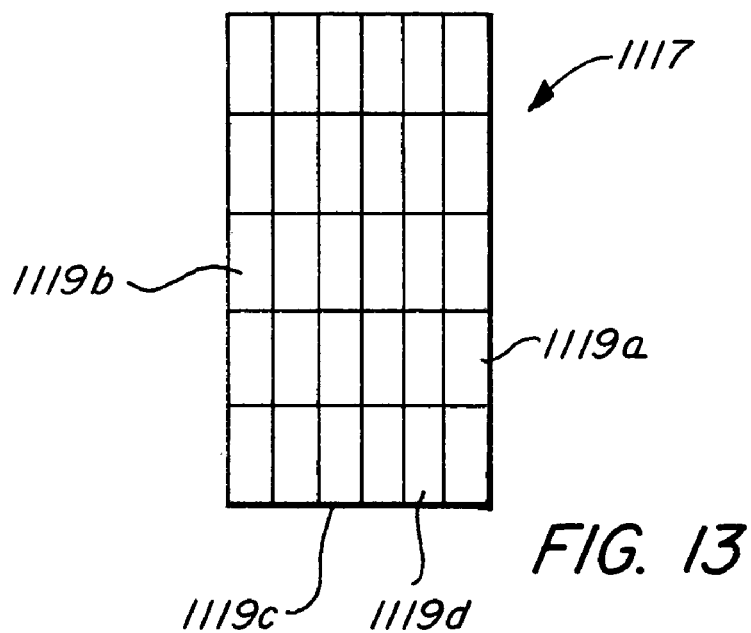
FIG. 13 is a schematic plan view illustrating a reticle divided into different feature sets or pattern portions for detecting different aberrations used in characterizing the optical system.

FIG. 13 represents a reticle 1117 that is divided into a plurality of different sections, having as an example thereof section 1119A, 1119B, 1119C, and 1119D among other sections that may have different reticle pattern portions configured to detect different aberrations simultaneously over a field to characterize the optical system. For example, magnification may be measured as the angle of retro-diffraction. Normal feature pitch and associated nominal diffraction beam angle can be measured differently from a calibrated nominal pitch substrate or calibrated prism or nominal angle between faces. Distortion, residual after magnification removal, may be measured as the scaled phase map residual. The scaling reflects the relationship between in-plane distortion, IPD, and the geometric constraints of the normal periodic pattern or grating pitch, the interferometer wavelength, and the local retro-diffraction beam angle. Coma may be measured by an induced image shift through focus seen as a second-order distortion across the field tilted through the depth of focus of the optical system.

Figure 14:
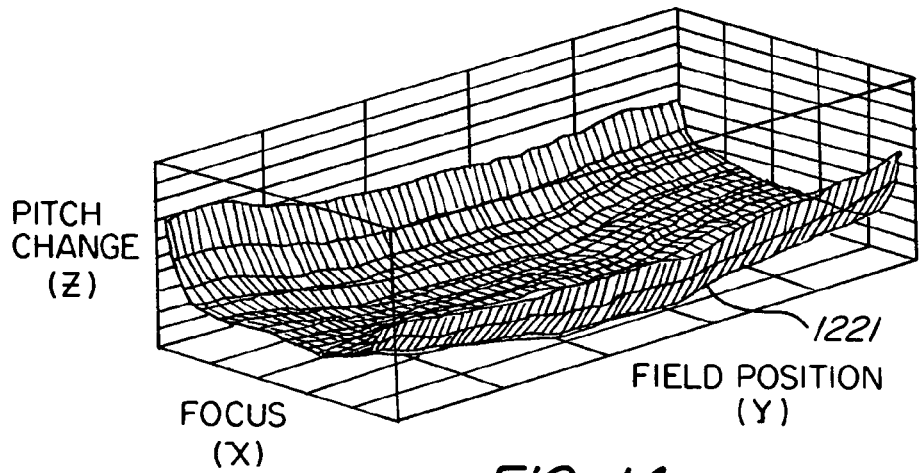
FIG. 14 is a perspective graphical view of an interferometer map illustrating detection of distortion or aberrations of an optical system in an embodiment of the present invention.

FIG. 14 is a perspective view of an interferometric analysis or map of a resist covered or photosensitive substrate exposed with the image of a basket weave or interlaced or cross periodic pattern or grating. The basket weave or cross periodic pattern or grating is a reticle having orthogonal lines over the entire field. The entire field of the optical system may be characterized by exposing a reticle over the field onto a tilted photosensitive substrate. The photosensitive substrate should be tilted so that the entire field falls within the depth of focus of the optical system. Because of the tilt, the x axis in FIG. 14 represents focus and field position in the x direction. The y axis represents field position in the y direction. The z axis represents the change in pitch between the lines in the periodic pattern or grating as a result of aberrations or distortions of the optical system. The surface contour 1221 provides information of the imaging characteristics of the optical system. The optical system may be characterized globally by interpreting the entire field, or locally by interpreting a desired portion of the field.

Figure 15:
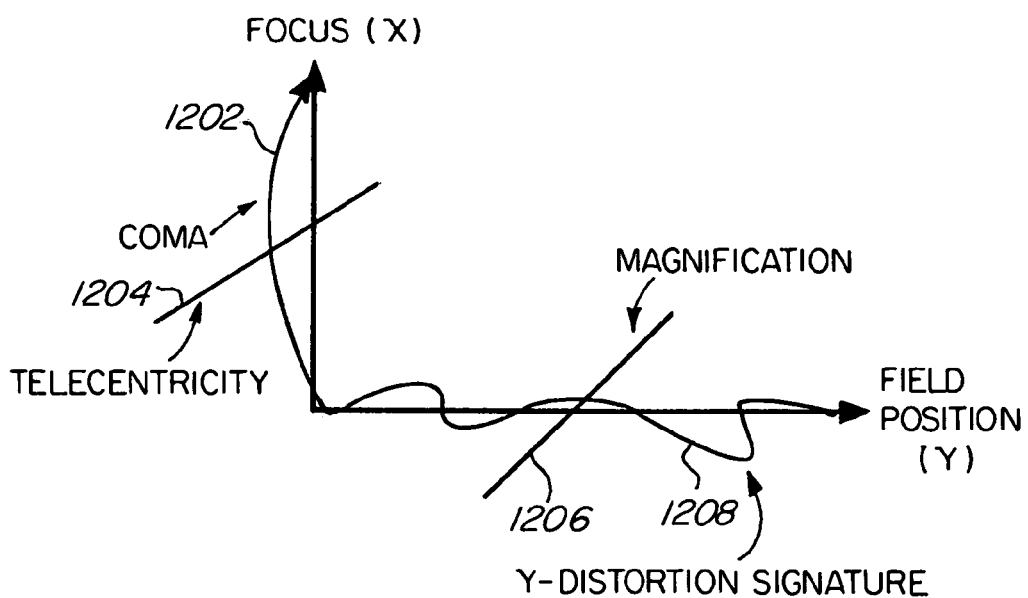
FIG. 15 is a graph illustrating the different distortions or aberrations that can be detected with an embodiment of the present invention.

FIG. 15 is a diagram graphically depicting different imaging characteristics and distortions or aberrations that can be obtained to characterize the optical system using this embodiment of the present invention. Arrow 1202 represents coma and is illustrated by the generally or overall curved surface contour 1221 shown in FIG. 14. Arrow 1204 represents telecentricity and is illustrated as a tilt in the x-y plane about the y axis of the surface contour 1221 shown in FIG. 14. Arrow 1206 represents overall or a mean magnification and is illustrated as a tilt in the x-y plane about the x axis of the surface contour 1221 shown in FIG. 14. Arrow 1208 represents y-distortion signature or a local change in magnification and is illustrated by the local changes in the surface contour 1221 shown in FIG. 14. If there where no aberrations or distortions over the entire field, the interferometric map would result in a flat un-tilted surface.

FIGS. 16A–16D schematically illustrate in perspective view the different distortions or aberrations of the optical system being characterized and illustrated graphically in FIG. 15. FIG. 16A represents lines having a tilt in the x-y plane about the x axis. This tilt represents global or overall magnification. Accordingly, if there is no global or overall magnification within the field, there is no tilt in the x-y plane about the x axis. FIG. 16B represents lines having a curve or second order bow through focus. This curve through focus or the x direction represents coma. FIG. 16C represents lines having a tilt in the x-y plane about the y axis. This tilt represents telecentricity. FIG. 16D represents lines having a local curve. This curve represents y distortion signature or local changes in magnification as a function of field position. All of these features or characteristics can be extracted from the interferometric map illustrated in FIG. 14 independently. Accordingly, the entire field of the optical system can he characterized in a single step without the need for multiple exposures or separate analysis.

FIG. 17 is a plan view of an exposed photosensitive substrate illustrating an embodiment of the present invention for determining best focus of an optical system. The image of a reticle is projected onto a photosensitive substrate 1322 over the field of an optical system. The reticle projects the image of a basket weave periodic pattern or grating pattern along the two longitudinal edges 1328 of a rectangular field. The photosensitive substrate 1322 is tilted with a compound tilt, a first tilt about the longitudinal axis and a second tilt or bow about the lateral axis, so that a relatively narrow first band 1331 is printed laterally across the photosensitive substrate within the two longitudinal edges 1328 during a first exposure. The photosensitive substrate 1322 is then shifted a known distance co-axial with the optical axis, in the z direction, so that a relatively narrow second band 1331' is printed laterally across the photosensitive substrate within the two longitudinal edges 1328 during a second exposure. The position of best focus for the optical system can be determined by analyzing the positions of the first and second printed bands 1331 and 1331'. The analysis is performed using geometry that can be readily determined or derived based upon the known distance shifted. For example, the focus position for the center of the field at point M is obtained by measuring the distance OA and O'A'. These numbers yield the position of the exposed first printed bands 1331 relative to the known field center M. Interpolation of the focus values for the two exposures forming first and second bands 1331 and 1331' yields the focus value for the field center at M. This focus value is along the optical axis only. Tilt error about the lateral axis is calibrated by measuring the distance AB along the substrate. The tilt slope is expressed in nanometers of focus shift, as determined by the focus difference between the two exposures, per millimeter of substrate, as determined by the distance AB. Using this tilt slope value the bow or tilt about the longitudinal axis error is determined by measuring the angle of the line A–A' or B–B' via measurement of the distance difference between distance OA and O'A' or distance OB and O'B'. From the measurement of four of these distances, the substrate is aligned to best focus plane with redundancy for measurement error correction or averaging. Alternatively the values may be extracted from the following formulas:

where:
- M' lies on the midpoint of a line midway between line A–A' and line B–B';
- IFS is the induced focus shift or intentional shift along the z or optical axis between the two exposures;
- IT is the induced tilt or intentional shift about the lateral axis Then,
- the slope (S) is equal to H/W;
- the focus error (FE) is equal to IFS/AB×MM';
- the tilt error (TE) about the longitudinal axis is equal to (IFS/AB)–IT; and
- the tilt or bow error (BE) about the lateral axis is equal to S×IFS/AB.

Figure 18:
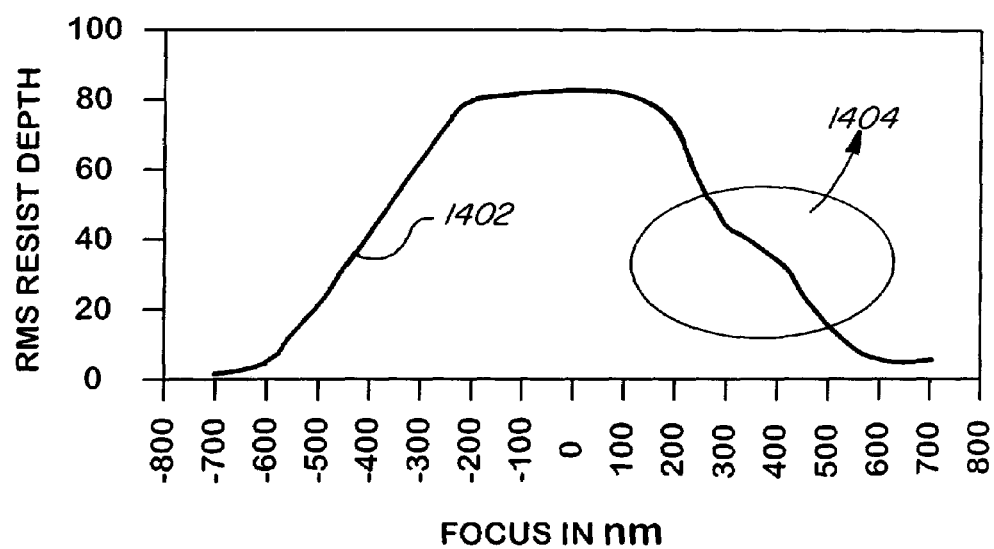
FIG. 18 is a graph illustrating detection of spherical aberrations in an embodiment of the present invention.

FIG. 18 illustrates the use of an embodiment of the present invention to detect spherical aberrations. Curve or line 1402 represents the resist depth as a function of focus. Due to a tilt through focus when exposing a photosensitive substrate, the periodic pattern or grating formed on the photosensitive substrate by the processed resist has a varying depth. The depth is greatest at best focus and becomes smaller as focus degrades. The asymmetry in curve or line 1402, identified at region 1404, is representative of spherical aberrations. Accordingly, the present invention can be applied to detect spherical aberrations in an optical system.

Figure 19A:
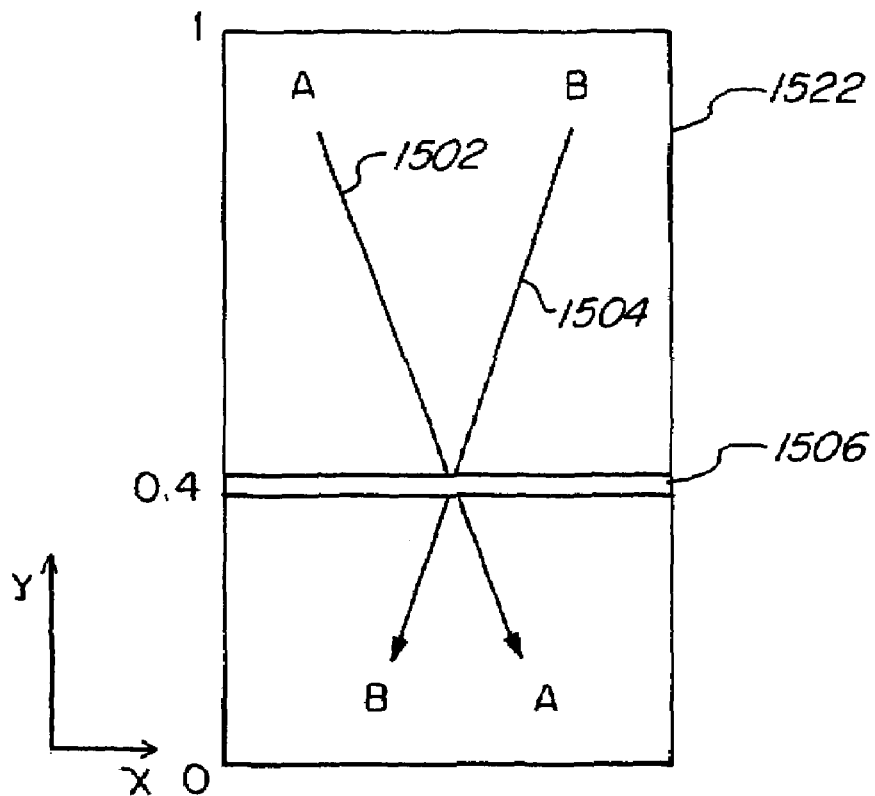
FIG. 19A is a schematic plan view illustrating an embodiment of the present invention for determining optimum placement of a reticle for enhanced imaging.
Figure 19B:
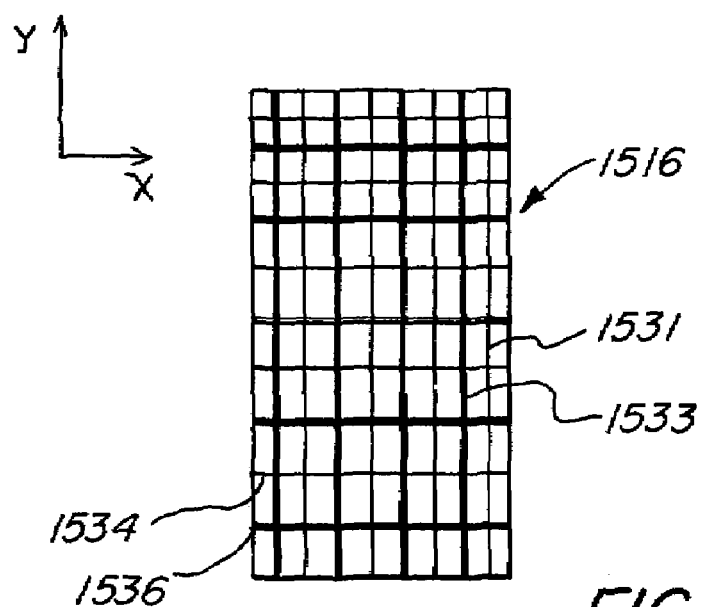
FIG. 19B is a schematic plan view of a reticle utilized in the embodiment of the present invention illustrated in FIG. 19A.

FIGS. 19A and 19B illustrate another embodiment of the present invention for determining initial placement of a reticle in the optical system for obtaining optimized imaging. Referring to FIGS. 19A and 19B, a photosensitive substrate 1522 is exposed by a reticle 1516. The reticle is tilted out of an x-y object plane about the x axis. The photosensitive substrate 1522 is preferably out of the x-y plane about the y axis. Accordingly, the reticle 1516 and the photosensitive substrate 1522 are tilted orthogonal with respect to each other, similar to the embodiment illustrate in FIG. 1. The reticle 1516 has a plurality of orthogonal interlaced lines with different line widths. For example, line 1531 is a relatively narrow vertical line width and line 1533 is a relatively wide vertical line with. The vertical lines 1531 and 1533 are alternating or interlaced in the x. direction. Relatively narrow horizontal line 1534 and relatively wide horizontal line 1536 are alternating or interlaced in the y direction. A grid pattern of alternating or interlaced horizontal and vertical lines of different widths is thereby formed. The grid pattern on the reticle 1522 is imaged through reticle position, due to the tilt in the reticle 1522, onto the photosensitive substrate 1522 through focus, due to the tilt in the photosensitive substrate 1522, during an exposure. The processed photosensitive substrate 1522 will have locus of best focus position as a function of line width or feature size. This locus is determined by examining the image, including the resist depth. Generally, the maximum resist depth determines best focus. That is at best focus, the resist is more fully exposed and therefore has greater depth.

The position at which the locus of best focus position for each different line width cross represents the preferred position for the reticle to minimize aberrations, and in particular spherical aberrations. Referring to FIG. 19A, the intersection of lines 1502 and 1504 represents the optimum position for the reticle 1506 to minimize spherical aberrations. Line 1506 represents the location or plane of optimum position for the positioning of the reticle 1516 to obtain the best image or minimum spherical aberrations. For example, as illustrated along the left longitudinal edge of the photosensitive substrate in FIG. 19A, if the reticle 1516, in FIG. 19B, was tilted about the x axis one unit, the line 1506 indicates that the reticle should be positioned at 0.4 units to obtain the best or optimum imaging. The line 1506 is drawn parallel to the axis of tilt of the reticle, or x axis. While only two different line widths have been illustrated to be alternating or interlaced, it should be appreciated that any number of different line widths may be alternating or interlaced.

While the present invention has been illustrated and described with respect to different embodiments and different feature sets or line patterns, clearly other feature sets or line patterns may be utilized and arranged in different ways to characterize an optical system. However, all of the embodiments of the present invention simultaneously image a variety of different pattern portions in a volume of space at different depths of focus. The recorded images of the plurality of pattern portions at different depths may be interferometrically analyzed so as to characterize the optical systems. This interferometric analysis is preferably accomplished in a single step such that the data obtained from the interferometric analysis of the recorded image of the reticle provides nearly complete characterization of the optical system. The present invention therefore prevents the need to sequentially select and analyze different locations within the field of the optical system. As a result, the teachings of the present invention result in a very rapid characterization of the optical systems.

Accordingly, it should be appreciated that the method and apparatus of the present invention makes possible the characterization of an optical system in a single exposure or imaging step to determine focus, field curvature, astigmatism, coma, and/or focal plane deviations of the optical system. The present invention is particularly applicable to the characterization of photolithographic lenses used in printing mask or reticle patterns onto a photosensitive substrate. The present invention determines the best focus by detecting the envelope of feature quality through focus, rather than through the evaluation of image quality or line quality in a three-dimensional array of individual sample points in x, y, and focus. The present invention yields a continuum of data through focus and reticle object position. Therefore, the present invention has the advantage of being focus self-seeking; that is, it is highly insensitive to normal focal plane location errors in that it will always print the zone of best focus if the wafer or photosensitive substrate field being exposed intercepts the depth of focus. The present invention has the advantage of being highly sensitive and having low noise and a single exposure providing rapid acquisition of characterizing parameters. The present invention eliminates the need for focal plane slicing with its associated time consuming multiple exposures. In testing, sensitivity and noise levels have been obtained routinely at less than the five nanometer level. These low levels cannot be obtained using prior techniques. Prior techniques generally degrade with decreasing line width. However, the present invention has the advantage that it becomes more robust as line width decreases. The present invention can also obtain full field data in seconds, a relatively short time. This is an important feature in lithographic tools using deep UV and beyond because of the small line sizes and thermally varying time constants. The ability of the present invention to utilize a full field exposure in a single shot eliminates alignment timing errors due to the scanning acquisition of data. The use of the plurality of different feature sets having multiplexed feature orientations, sizes, and line types allows for the determination of focus position, astigmatism, field curvature and depth of focus. Additionally, the present invention can yield information on coma, spherical, and variation of coherence. The present invention, in consisting of multiplexed periodic features that are imaged by the imaging system to be tested and a lithographic recording process, including a metrology tool to analyze the printed images makes possible the rapid characterization of an optical system. The feature sets may be a group or isolated variant line types, shapes, sizes and orientations. The present invention images these feature sets through and beyond the depth of focus of the imaging system in a single exposure. The envelope or feature quality through focus is printed and analyzed. This analysis may consist of full depth of focus data evaluation, as in the case of auto-correlation and cross-correlation analysis. Alternatively, the analysis may identify envelope maxima or minima asymmetry or slope. This is contrary to the prior techniques that analyze individual features at pre-determined and consequently non-optimum discrete focal positions. The quality of particular feature sets through focus can be used to determine flat focus, field curvature, astigmatism, spherical aberration, partial coherence, distortion and coma, depending upon the feature type orientation and/or size selected. In a case of astigmatism, different line orientations can be interlaced down the field and read by a dark field or interferometric microscope. Alternatively, different line orientations can be interlaced across the field and read by an interferometric microscope or atomic force microscope. In the case of distortion, the features can be read using a full field interferometer.

Accordingly, it should be appreciated that the present invention greatly advances the ability to characterize quickly and easily an optical system and in particular projection optics used in photolithography for the manufacture of semiconductor wafers. From a single exposure or data acquisition step, valuable information may be obtained characterizing the optical system at a single point in time. This greatly increases throughput and yield in that imaging performance is maintained at a high level.

Although the preferred embodiments have been illustrated and described, it will be obvious to those skilled in the art that various modifications may be made without departing from the spirit and scope of the this invention.

What is claimed is:

1. A method, comprising:
   using optics having an optical axis to project an image of a reticle having more than one periodic feature therein;
   using rows of at least one of vertical, horizontal, and tilted lines as the periodic features;
   detecting an interference pattern in the image of the reticle substantially simultaneously at multiple locations and in a direction coaxial with the optical axis; and
   analyzing the interference pattern to obtain characterization of the optics.

2. A method, comprising:
   illuminating more than one periodic pattern in an object plane of an object space of an optical system, the object plane extending over a range of depths through the object space;
   using the optical system to image the periodic patterns onto an image volume; and
   analyzing an interference pattern in an image of the periodic patterns formed within the image volume, whereby optical system characteristics are determined from the interference pattern.

3. The method of claim 2, further comprising tilting the image within the image volume.

4. The method of claim 2, further comprising:
   tilting the object plane with respect to an optical axis of the optical system; and
   generating a continuum of object positions as a function of field position.

5. The method of claim 2, further comprising tilting the image with respect to an optical axis of the optical system.

6. The method of claim 2, further comprising:
   tilting the object plane and the recorded image orthogonally with respect to each other; and
   generating a continuum of object positions in one axis and focus positions in another orthogonal axis.

7. The method of claim 2, further comprising extracting an envelope of feature resolution through focus.

8. The method of claim 2, further comprising extracting astigmatism of the optical system as a function of an orientation of the periodic patterns.

9. The method of claim 2, further comprising extracting coma of the optical system as a second order distortion signature versus focus mapped across the field.

10. The method of claim 2, further comprising extracting spherical aberration of the optical system as a function of best focus difference between line sizes of the periodic patterns versus field position.

11. The method of claim 2, further comprising extracting optimum reticle or object position as a function of field position of minimum spherical aberration as seen by minimum best focus difference between line sizes.

12. The method of claim 2, further comprising analyzing the image using a dark field microscope.

13. The method of claim 2, further comprising analyzing the image using white light.

14. The method of claim 2, further comprising analyzing the image using a laser microscopic interferometer.

15. The method of claim 2, further comprising analyzing the image in a single exposure using a large aperture interferometer.

16. The method of claim 2, further comprising calculating a best focus position.

17. The method of claim 2, further comprising calculating spherical aberrations.

18. An apparatus, comprising:
   an optical system;
   illumination means for projecting an image of a reticle having more than one periodic feature thereon within a volume of image space;
   means for detecting interference patterns in the image at different locations comprising different depths of focus within the volume of image space; and
   means for analyzing the interference patterns and determining optical system imaging characteristics.

* * * * *